(12) United States Patent
Yumoto et al.

(10) Patent No.: US 6,546,542 B2
(45) Date of Patent: Apr. 8, 2003

(54) PARAMETERIZED DESIGNING METHOD OF DATA DRIVEN INFORMATION PROCESSOR EMPLOYING SELF-TIMED PIPELINE CONTROL

(75) Inventors: Manabu Yumoto, Nara (JP); Munehiro Uratani, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/876,062

(22) Filed: Jun. 8, 2001

(65) Prior Publication Data

US 2002/0023250 A1 Feb. 21, 2002

(30) Foreign Application Priority Data

Jun. 8, 2000 (JP) .......................... 2000-171860

(51) Int. Cl.⁷ .......................... G06F 17/50; G06F 9/455; G06F 9/45
(52) U.S. Cl. .................. 716/18; 716/5; 716/7; 716/11
(58) Field of Search .......................... 716/5, 7, 11, 18

(56) References Cited

U.S. PATENT DOCUMENTS

| | | | |
|---|---|---|---|
| 5,333,279 A | * | 7/1994 | Dunning .................... 710/100 |
| 5,483,627 A | * | 1/1996 | Silverbrook et al. ........ 345/502 |
| 5,640,525 A | | 6/1997 | Yumoto et al. |
| 5,860,019 A | | 1/1999 | Yumoto |
| 6,195,776 B1 | * | 2/2001 | Ruiz et al. .................... 703/22 |
| 6,199,152 B1 | * | 3/2001 | Kelly et al. .................. 711/206 |
| 6,219,628 B1 | * | 4/2001 | Kodosky et al. .............. 702/57 |
| 6,226,776 B1 | * | 5/2001 | Panchul et al. ............... 716/18 |
| 6,408,428 B1 | * | 6/2002 | Schlansker et al. ........... 716/17 |
| 2001/0025369 A1 | * | 9/2001 | Chang et al. ................. 716/18 |

* cited by examiner

*Primary Examiner*—David Nelms
*Assistant Examiner*—Ly Duy Pham
(74) *Attorney, Agent, or Firm*—Birch, Stewart, Kolasch & Birch, LLP

(57) ABSTRACT

A method of designing a data driven information processor employing self-timed pipeline control includes the steps of preparing a computer-readable library file in which is written designing parameters related to a functional block and processor of an apparatus that is the subject of design, setting a parameter value for each designing parameter according to a design specification, and executing on a computer a tool that rewrites each description of the parameter in the library file using a set parameter value and producing a register transfer level design description.

26 Claims, 20 Drawing Sheets

| MEGAENGINE (ME) | MACROPROCESSOR (MP) |
|---|---|
| ME1 | MP1x2, MP2x2 |
| ME2 | MP1x2 |

FIG.9

| MACROPROCESSOR TYPE | ROUTER | INPUT PORT | OUTPUT PORT | NANOPROCESSOR TYPE |
|---|---|---|---|---|
| MP1 | R1 | IP1 | OP1 | NP1, NP2, NP3, NP4 |
| MP2 | R2 | IP2 | OP2 | NP5, NP6 |

| NANOPROCESSOR TYPE | CST | FC | FP | PS |
|---|---|---|---|---|
| NP1 | CST1 | FC1 | FP1 | PS1 |
| NP2 | CST2 | FC1 | FP2 | PS1 |
| NP3 | CST1 | FC1 | FP3 | PS1 |
| NP4 | CST3 | FC1 | FP4 | PS1 |
| NP5 | CST4 | — | FP5 | PS1 |
| NP6 | CST3 | FC2 | FP6 | PS1 |

*FIG.14*

```
// Set CONFIG=1 ==> TYPICAL, CONFIG=2 ==> MAXIMUM,
//     CONFIG=3 ==> MINIMUM, CONFIG=4 ==> Absolute MAXIMUM
`let  CONFIG = 1 ~190
`switch (CONFIG)
`case 1
// You have selected TYPICAL Configuration of parameter
`let   DW   = 12
`let   ND   = 8
`let   PPLN = 2
`let   ND_WIDTH = 8
`let   GEN_WIDTH = 27
`let   FC_DATA_MEM_WIDTH = 32   }192
`let   CMP = 1
`let   CME = 1
`let   CMW = 45
`let   CPW = 45
`let   ACW = 44
`case 2
// You have selected MAXIMUM Configuration of parameter
`let   DW   = 16
`let   ND   = 4
`let   PPLN = 5
`let   ND_WIDTH = 12
`let   GEN_WIDTH = 32
`let   FC_DATA_MEM_WIDTH = 32   }194
`let   CMP = 1
`let   CME = 1
`let   CMW = 65
`let   CPW = 65
`let   ACW = 64
`case 3
// You have selected MINIMUM Configuration of parameter
`let   DW   = 5
`let   N    = 8
`let   PPLN = 3
`let   ND_WIDTH = 6
`let   GEN_WIDTH = 20
`let   FC_DATA_MEM_WIDTH = 32   }196
`let   CMP = 1
`let   CME = 1
`let   CMW = 25
`let   CPW = 30
`let   ACW = 24
```

FIG. 15

```
module cst1 (
        ci,
        ri,
        d,
        ro,
        co,
        q
) ;

// Parameters
'include "np1_param_define.v"

// Inputs
input   ci;     // req-in
input   ri;             // ack-in
input   [cst1_packet_in_width-1:0] d;//input packet // Outputs
output  [cst1_packet_out_width-1:0] q;//output packet
output  ro;                     // ack-out
output  co;                     // req-out // Wires
wire    w_cp1; // clock for pipeline stage #1
wire    w_cp2; // clock for pipeline stage #2
wire    w_cp3; // clock for pipeline stage #3

// Instantiations
cst1_dpath cst1_dpath (
        .d (d) ,
'for (vv=1 ; vv<PPLN ; vv++)
'if (PPLN !=1)
        .cp'vv (w_cp'vv) ,
'endif
'endfor
        .q (q)
                ) ;

cst1_timing cst1_timing (
'for (vv=1 ; vv<PPLN ; vv++)
'if (PPLN !=1)
        .cp'vv (w_cp'vv) ,
'endif
'endfor
        .ci (ci) ,
        .ri (ri) ,
        .co (co) ,
        .ro (ro) ,
) ;

endmodule // cst1
```

FIG.16

```
module cst1_timing (
        ci,
        ri,
        ro,
        co,
'for (vv=1; vv<PPLN; vv++)
'if (PPLN != 1)
        cp'vv,
'endif
'endfor
) ;

// Inputs
input  ci;
input  ri;

// Outputs
output  ro;
output  co;
'for (vv=1; vv<PPLN; vv++)
'if (PPLN != 1)
output  cp'vv;
'endif
'endfor // Wires
wire   c_ci1, c_ci2, c_ci3 , c_ci4, c_cij;
wire   c_ro1, c_ro2, c_ro3 , c_ro4, c_roj;
wire   s_ci1, s_ci2, s_ci3, s_ci4, s_ci5, s_ci6, s_ci7, s_ci8;
wire   s_ci9, s_ci10, s_ci11, s_ci12, s_ci13, s_ci14, s_ci15, s_cij ;
wire   s_ro1, s_ro2, s_ro3, s_ro4, s_ro5, s_ro6, s_ro7, s_ro8;
wire   s_ro9, s_ro10, s_ro11, s_ro12, s_ro13, s_ro14, s_ro15, s_roj ;
wire   o_ci, o_ro;
wire   no_conn_c_ce1_cr,
wire   no_conn_c_ce2_cr,
wire   no_conn_c_ce3_feb ;
wire   no_conn_c_ce4_cr ;
wire   no_conn_s_ce1_cr;
wire   no_conn_s_ce2_cr;
wire   no_conn_s_ce3_cr;
wire   no_conn_s_ce4_feb;
wire   no_conn_s_ce5_cr,
wire   no_conn_o_ce1_cr, // C-elements for the common instructions portion
'for (vv=1; vv<MULSTAGE; vv++)
'if (MULSTAGE !=1)
'let NE = (vv+1)

c c'vv ( .ci (ci'vv) ,
         .ro (ro'vv) ,
         .cp (cp'vv) ,
         .co (ci'NE) ,
         .ri (ro'NE)
) ;
'endif
'endfor
endmodule
```

FIG. 17

```
-- Modification History: 0.1 initial version
*/
module cst( d, cp1, cp2, cp3, q, ex);
// Parameters
include "cst_config.v"  ~200
// Clocks, Resets
    input                               cp1; // clock for pipeline stage #1
    input                               cp2; // clock for pipeline stage #2
    input                               cp3; // clock for pipeline stage #3
// Inputs
    input [cst1_packet_in_width-1:0]    d;   // input packet
// Outputs
    output [cst1_packet_out_width-1:0]  q;   // output packet
    output                              ex;  // extinguish signal to the timing section
// Wires
    wire                                     // packet (extinguish)
    wire                                     // the output packet
    wire ['num_upper_banks_minus1:0]    dcst_upper;
    wire                                ld;  // LOAD command to erase the
    wire                                dcst; // DUMP command to rearrange
    wire                                cnd ;                ex_d;
    wire                                opc;                 list;
    wire                                                     ctl;
    wire [cnd_width-1:0]
    wire [opc_width-1:0]
    wire                                node;
    wire [nd_width-1:0]                 gen_num;
    wire [gen_width-1:0]                cnt ;                li();
    wire [cnt_width-1:0]
```

FIG.18

```
module cst1 (
        ci,
        ri,
        d,
        ro,
        co,
        q
) ;

// Parameters
`include "np1_param_define.v"

// Inputs
input   ci;             // req-in
input   ri;             // ack-in
input   [cst1_packet_in_width-1:0] d;       // input packet // Outputs
output  [cst1_packet_out_width-1:0] q;  // output packet
output  ro;             // ack-out
output  co;             // req-out // Wires
wire    w_cp1;  // clock for pipeline stage #1
wire    w_cp2;  // clock for pipeline stage #2
wire    w_cp3;  // clock for pipeline stage #3

// Instantiations
cst1_dpath cst1_dpath (
        .d (d) ,
        .cp1 (w_cp1) ,
        .cp2 (w_cp2) ,
        .cp3 (w_cp3) ,
        .q (q)
                ) ;

cst1_timing cst1_timing (
        .cp1 (w_cp1) ,
        .cp2 (w_cp2) ,
        .cp3 (w_cp3) ,
        .ci (ci) ,
        .ri (ri) ,
        .co (co) ,
        .ro (ro) ,
) ;

endmodule // cst1
```

FIG.19

```
module cst1_timing (
        ci,
        ri,
        ro,
        co,
        cp1,
        cp2,
        cp3
) ;

// Inputs
input   ci;    // req-in
input   ri;    // ack-in

// Outputs
output  ro;    // ack-out
output  co;    // req-out
output  cp1;   // clock for pipeline stage #1
output  cp2;   // clock for pipeline stage #2
output  cp3;   // clock for pipeline stage #3

// Wires
wire w_ce1_co;
wire w_ce2_ro;
wire w_ce2_co;
wire w_ce3_ro;
wire w_unconnect_1;
wire w_unconnect_2;

// Assignments
// C-element #1
c c1 (
        .ci (ci) ,
        .ro (ro) ,
        .co (w_ce1_co) ,
        .ri (w_ce2_ro) ,
        .cp (cp1) ,
) ;

// C-element #2
c c2 (
        .ci (w_ce1_co) ,
        .ro (w_ce2_ro) ,
        .co (w_ce2_co) ,
        .ri (w_ce3_ro) ,
        .cp (cp2) ,
) ;

// C-element #3
c c3 (
        .ci (w_ce2_co) ,
        .ro (w_ce3_ro) ,
        .co (co) ,
        .ri (ri) ,
        .cp (cp3) ,
) ;
endmodule
```

FIG.20

```
module cst(d, cp1, cp2, cp3, q, ex);

// Parameters
//*************************************************************
// NP1 Global parameter declarations
//*************************************************************
parameter  data_width = 12;    // width of each data RDi / LDi  ⎫
parameter  num_data   = 8;     // number of data in packet      ⎬ 210
parameter  gen_width  = 27;    // width of Generation Number    ⎪
parameter  nd_width   = 8;     // width of NODE field           ⎭

//*************************************************************
// CST1 Specific parameters
//*************************************************************
// RAM parameters
parameter  cst_acc_mem_part       = 1;       //1   ⎫
parameter  cst_acc_mem_part_e     = 1;       //1   ⎬ 212
parameter  cst_acc_mem_word_width = 45;      //45  ⎪
parameter  cst_acc_mem_cons_width = 45;      //45  ⎭
```

FIG.21

```
module cst(d, cp1, cp2, cp3, q, ex);

// Parameters
//****************************************************************
// NP1 Global parameter declarations
//****************************************************************
parameter    data_width    = 16;    // width of each data RDi / LDi
parameter    num_data      = 4;     // number of data in packet           } 214
parameter    gen_width     = 32;    // width of Generation Number
parameter    nd_width      = 12;    // width of NODE field //****************************************************************
// CST1 Specific parameters
//****************************************************************
// RAM parameters
parameter    cst_acc_mem_part        = 1;
parameter    cst_acc_mem_part_e      = 1;                                 } 216
parameter    cst_acc_mem_word_width  = 65;
parameter    cst_acc_mem_cons_width  = 65;
```

FIG.22

EXAMPLE OF PARAMETERS APPLICABLE TO RESPECTIVE FUNCTIONAL BLOCKS

| | NUMBER OF PARALLEL DATA | DATA BIT WIDTH | BIT WIDTH OF NODE NUMBER | ACCUMULATOR BIT WIDTH | NUMBER OF ROUTER I/O PORTS | DATA MEMORY TYPE | | | | NUMBER OF PIPELINE STAGES |
|---|---|---|---|---|---|---|---|---|---|---|
| | | | | | | SYNCHRONOUS/ ASYNCHRONOUS | NUMBER OF PORTS | BIT WRITE FUNCTION | | |
| CST | ○ | ○ | ○ | | | ○ | ○ | ○ | | ○ |
| FC | ○ | ○ | ○ | | | ○ | ○ | ○ | | ○ |
| FP | ○ | ○ | | ○ | | | | | | ○ |
| PS | ○ | ○ | ○ | | | ○ | ○ | ○ | | ○ |
| ROUTER | ○ | | | | ○ | | | | | ○ |
| INPUT PORT | | ○ | | | | | | | | ○ |
| OUTPUT PORT | | ○ | | | | | | | | ○ |

PARAMETERIZED DESIGNING METHOD OF DATA DRIVEN INFORMATION PROCESSOR EMPLOYING SELF-TIMED PIPELINE CONTROL

BACKGROUND OF THE INVENTION

1. Field of the Invention

The present invention relates to a designing method and an apparatus of a data driven information processor. Particularly, the present invention relates to a method and an apparatus of efficiently designing a data driven information processor of custom LSI (Large-Scale Integrated circuit) that is optimized for various applications.

2. Description of the Background Art

A von Neumann information processor is well known. The von Neumann information processor has a program of a series of instructions prestored in a program memory. By sequentially addressing the program memory through a program counter, the addressed instruction is read and executed.

An information processor of architecture differing from that of the von Neumann information processor is generally called a "non-von Neumann" information processor. The non-von Neumann information processor includes a data driven information processor (Data Driven Media Processor: DDMP).

The DDMP employs architecture based on parallel processing of instructions. The DDMP is not associated with the concept of a program counter. As soon as the data that are the subject of operation are available in the form of a packet in the DDMP, the instruction of relevant data processing can be executed. Since a plurality of instructions are driven at the same time in accordance with the flow of data, programs are executed in parallel according to the natural data flow in the DDMP. Accordingly, the time required for operation can be reduced significantly compared to that of the von Neumann information processor.

The DDMP transfers a packet by a self-timed pipeline control scheme. The self-timed pipeline scheme differs from the clocked pipeline control scheme.

For clocked pipeline control, cascaded latch circuits are prepared. These latch circuits are driven by a clock signal to shift a data packet between the latch circuits. The packet is processed by a logic circuit arranged between the latch circuits.

Referring to FIG. 1, a DDMP 240 employing the self-timed pipeline control scheme includes cascaded data latches 242, 246 and 250, logic circuits 244 and 248 arranged between these data latches 242, 246 and 250, and local handshake type data transfer control circuits (referred to as "C element" hereinafter) 260, 262 and 264 cascade-connected to each other to effect data handshaking transfer between the data latches by transmitting/receiving a transmission signal SEND and a response signal ACK with respect to each other to apply a data latch timing signal to data latches 242, 246, 250, and the like.

Thus, a data transfer circuit configuration formed of data latch circuits and C elements is provided in succession in DDMP 240 employing the self-timed pipeline control scheme. Data is transferred sequentially through a plurality of data latches and is subjected to a relevant process by an appropriate logic circuit arranged therebetween.

Reflecting the recent development in semiconductor equipment and digital signal processing technology, the market of equipment employing digital signal processing systems has seen rapid increase and change. Accordingly, the application field of DDMPs is also expanding.

The field of image processing and video signal processing that involves a great amount of operation processing occupies a relatively large portion in the DDMP application field. Particularly in the field of image processing that deals with television signals corresponding to a motion picture as well as still picture signals, there are many processes specific to each technical field. Many of these processes can be realized using a general purpose DDMP. In such a case, a function or the like that is not used in that particular technical field may be included in the DDMP. This induces the problem that the chip of the LSI is unnecessarily increased in size. Furthermore, the usage of a general purpose DDMP impedes increase of the processing speed and reduction of power consumption. Such various technical problems are encountered.

In view of the above-described problems, there is the growing demand for an LSI chip realizing a DDMP of a particular specification from users. The need arises for manufacturers to establish the technology of designing various types of custom LSIs optimized to each of such special specifications.

To this end, an LSI with a DDMP was generally designed using a bottom up design procedure or a top down design procedure.

The design flow in designing an LSI using the bottom up design procedure will be schematically described with reference to FIG. 2. In the bottom up design procedure, first an LSI specification is provided (280). The LSI specification specifies the operation performance indicated by the processing amount per unit time required for the LSI, the total memory capacitance, architecture, and the like.

The function/logic designing is carried out based on this LSI specification (282). Specifically, the structure of the megaengine, macroprocessor, router, nanoprocessor, functional block and the like as well as the format of the packets circulating therethrough are determined.

Then, gate level designing is carried out based on the obtained logic design result (284). In gate level designing, the logic design result is replaced manually with a gate level circuit that is required in the LSI design. Here, the gate level circuit refers to logic circuits such as an inversion logic element (inverter: INV), logical product element (AND), logical sum element (OR) and the like.

The obtained gate level design is verified through logic/timing simulation (286). The layout is designed using the verified net-list (288).

The design flow of designing an LSI using the top down design procedure will be described with reference to FIG. 3. Similar to the bottom up design procedure, an LSI specification is first provided (300). The function/logic design is implemented based on the applied LSI specification (302).

The function of this level is described manually at the register transfer level (RTL) using a function description language for use with LSI designing (Verilog-HDL (Hardware Description Language), VHDL (VHSIC Hardware Description Language) and the like) (310). Then, an RTL simulation is run to verify the function at this level (312). The function description verified by the RTL simulation is net-listed using a logic synthesis tool (314).

A logic/timing simulation is run with respect to the obtained net-list (316). The layout is designed using the verified net-list (318).

In the bottom up design procedure, manual work is required at the stage of gate level designing. In the top down design procedure, manual work is required at the RTL description stage. In either case, manual work is required every time in designing. The required labor of the manual work was not so noticeable when the number of gates included in the LSI was relatively small. However, the manpower and time required for designing has increased significantly lately since as many as several hundred thousand to several million gates are accommodated in one LSI. Accordingly, the designing cost will increase. Furthermore, as the specification is diversified, designing corresponding to each type must be implemented. It was therefore difficult to effectively utilize the currently available design resource.

In either case of using the conventional bottom up designing procedure or top down designing procedure, extensive resource must be invested in the development of a processor LSI using a self-timed data driven processor (custom DDMP LSI) that is optimized (customized) for each of the manifold applications. In other words, there are the disadvantages such as more manpower required for designing and a longer designing period. Accordingly, the designing cost will become higher. Since it is difficult to effectively utilize the currently-available design resource, the designing cost cannot be easily reduced.

There is also the problem that the number of elements to be determined according to the DDMP scheme is great in comparison to that of clocked pipeline control. For example, in clocked pipeline control, the packet requires a data region and an address region. In the DDMP scheme, a data region, a generation number region for tag information, the region for destination node numbers and instruction codes, and the like must be provided. Furthermore, the size of each of these regions must be determined.

In contrast to the case where the operation can be controlled in a one-to-one correspondence by a clock signal in clocked pipeline control, a C element that controls data latching and transfer based on the transmission and reception of transmission signal SEND and response signal ACK mentioned above is employed in the DDMP scheme. This means that the transfer rate of the C element must be additionally defined.

In other words, the number of elements that must be determined in designing is extremely great when the DDMP scheme is used. For this reason and the necessity of accommodating each different specification, designing by the DDMP scheme is more difficult than designing of apparatuses of other schemes.

SUMMARY OF THE INVENTION

In view of the foregoing, an object of the present invention is to provide a method and an apparatus of designing a data driven information processor that allows effective usage of designing resource available from the past, whereby various types of custom DDMP LSIs can be designed at a relatively low designing cost.

Another object of the present invention is to provide a method and an apparatus of designing a data driven information processor that allows effective usage of designing resource available from the past and that can easily determine elements that are to be made, whereby various types of custom DDMP LSIs can be designed at a relatively low designing cost.

According to an aspect of the present invention, a designing method of a data driven information processor employing self-timed pipeline control through use of a computer includes the steps of preparing a computer-readable library file in which is written a designing parameter written in a generalized format, related to a functional block and processor of the data driven information processor that is the subject of designing, setting a parameter value for each designing parameter according to a design specification, and executing on the computer a tool that rewrites each description of the parameters in the library file using the set parameter value to produce a design description of a register transfer level.

According to another aspect of the present invention, a designing method of a data driven information processor employing self-timed pipeline control through use of a computer includes the steps of preparing a computer-readable library file formed of a register transfer level design description including a designing parameter written in a general format and using a predetermined language, related to a functional block and processor of the data driven information processor that is the subject of designing, preparing a computer-readable parameter file in which is written an instruction setting a specific parameter value for each of the designing parameters in a predetermined language according to a design specification, producing a register transfer level design description having a specific parameter value set by executing a program that reads in the library file and the parameter file and rewrites the library file so as to include contents of the parameter file, prior to writing a parameter in the library file, and implementing circuit designing using the register transfer level design description having specific parameter values set.

According to a further aspect of the present invention, a designing apparatus of a data driven information processor employing self-timed pipeline control through use of a computer includes a storage device storing a computer-readable library file in which is generally written a designing parameter related to a functional block and processor of the data driven information processor that is the subject of designing, an input device setting a parameter value for each designing parameter according to a design specification, and an execution device executing a tool that rewrites each description of the parameter in the library file using a set parameter value to produce a register transfer level design description.

According to still another aspect of the present invention, an apparatus of designing a data driven information processor employing self-timed pipeline control through use of a computer includes a first storage device storing a computer-readable library file formed of a register transfer level design description including a designing parameter written in a general format and using a predetermined language, related to a functional block and processor of the data driven information processor that is the subject of designing, a second storage device storing a computer-readable parameter file in which is written in a predetermined language an instruction setting a specific parameter value for each design parameter according to a design specification, a third storage device storing a program that reads in the library file and parameter file and rewrites the library file so as to include contents of the parameter file prior to writing the parameter in the library file, and a circuit design processing device that implements circuit designing using the register transfer level design description having a specific parameter value set.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 shows an example of structural elements of the macroprocessor of the DDMP.

FIG. 14 shows a portion of a DDMP design parameter file based on a DDMP LSI specification.

FIG. 15 shows a portion of a DDMP functional block/processor library file of a constant fetch module of a NP1.

FIG. 16 shows a portion of a DDMP functional block/processor library file of a CST1_TIMING portion in a constant fetch module of NP1.

FIG. 17 shows a portion of a DDMP functional block/processor library file of a CST1_DATAPATH portion in a constant fetch module of P1.

FIG. 18 shows a portion of RTL descriptions in a constant fetch module of NP1 produced by executing a parameterize RTL design tool.

FIG. 19 shows a portion of RTL descriptions in a CST1_TIMING portion in the constant fetch module of NP1, produced by executing a parameterize RTL design tool.

FIG. 20 shows a portion of RTL descriptions in a CST1_DATAPATH portion in the constant fetch module of NP1, produced under a parameter TYP condition by executing a parameterize RTL design tool.

FIG. 21 shows a portion of RTL descriptions in a CST1_DATAPATH portion in the constant fetch module of NP1, produced under a parameter MAX condition by executing a parameterize RTL design tool.

FIG. 22 shows in table format parameters that can be applied to each functional block.

DESCRIPTION OF THE PREFERRED EMBODIMENTS

Figure 4:
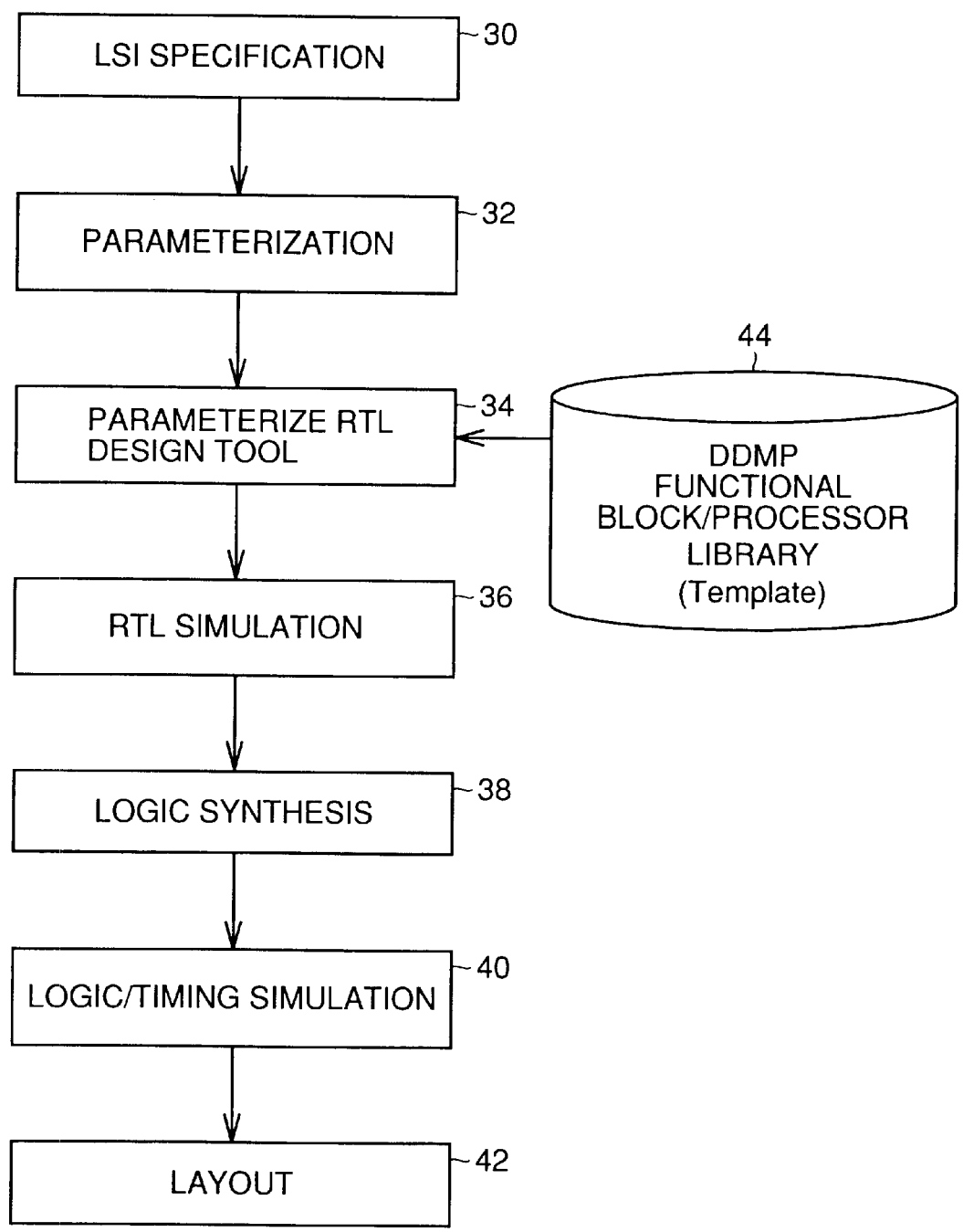
FIG. 4 is a flow chart of a method of designing a DDMP LSI according to an embodiment of the present invention.

FIG. 4 is a design flow of a DDMP LSI by a parameterize procedure according to an embodiment of the present invention. In this design procedure, a DDMP functional block/processor library 44 is prepared in advance. Parameterization is effected (32) that determines specific values such as the packet data width, memory type, memory capacitance, number of parallel data paths that are a set of preset parameters based on an applied LSI specification (30) as to the operation performance, total memory capacitance, architecture and the like. These specific parameter values are set in the prepared DDMP functional block/processor library 44, and a parameterize RTL design tool is executed (34). Accordingly, a RTL descriptor file corresponding to the applied LSI specification is produced automatically.

An RTL simulation is run on the obtained RTL descriptor file to verify the function at this level (36). The verified logic description is net-listed using a logic synthesis tool (38). The net-list is verified by running a logic/timing simulation on the obtained net-list (40). Layout is effected using the verified net-list (42).

The designing flow of a DDMP LSI by the parameterize procedure according to the present embodiment will be described in detail hereinafter. First, the hierarchical structure and elements of the DDMP that is the subject of designing will be described with reference to FIG. 5. The DDMP includes a plurality of megaengines 50 (for example, megaengines (ME) 1, ME2). The number at the end of each element such as "ME1" indicates the type of each element. For example, elements having the same number correspond to the same type whereas elements having different numbers correspond to a different type.

Each megaengine 50 includes a plurality of macroprocessors 52 (for example, macroprocessors (MP) 1, MP2).

Each macroprocessor 52 includes an input port 56 and an output port 58 that are the input and output units with respect to an external source, a nanoprocessor 60, and a router 54 to merge and branch packets with respect to another nanoprocessor (NP).

Nanoprocessor 60 includes a constant fetch module CST, a data pair generation (firing control) module FC, a function processing module FP, and a program fetch module PS, and the like.

Figure 5:
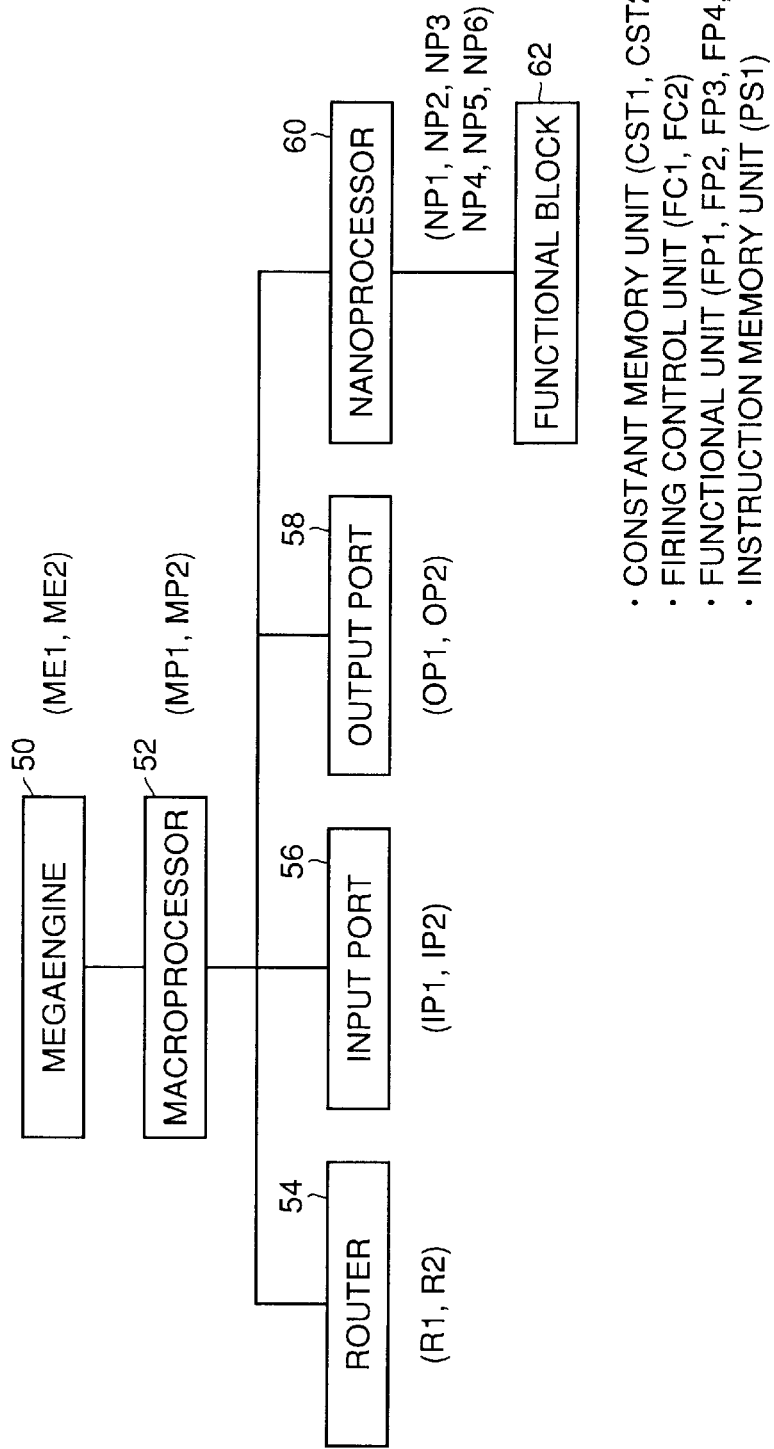
FIG. 5 shows the hierarchical structure and examples of structural elements of a DDMP.

As shown in FIG. 5, the DDMP is formed of a hierarchical structure of various structural elements.

Figure 6:
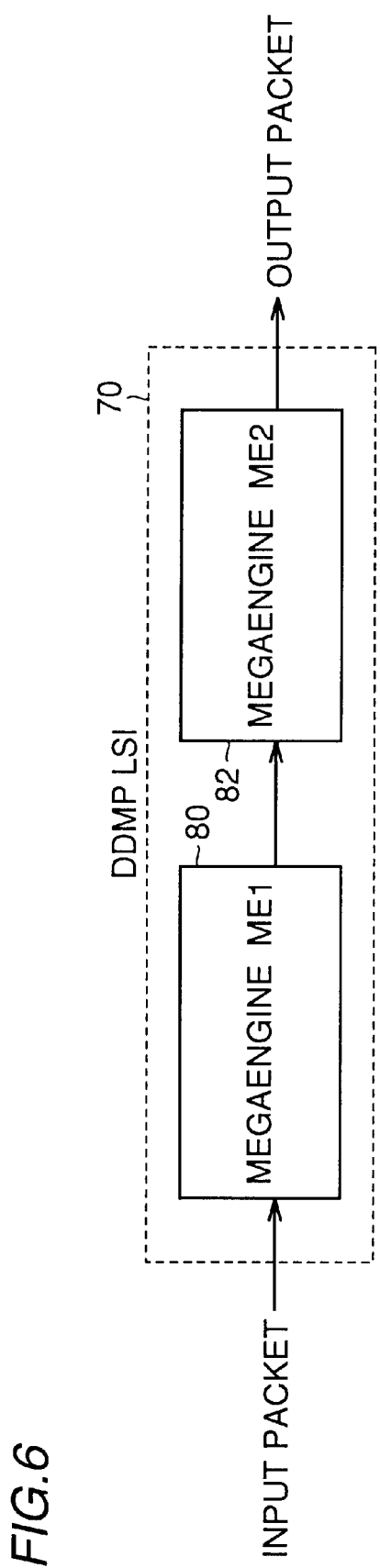
FIG. 6 shows the structure of a megaengine of a DDMP.

An example of a structure of an DDMP LSI is shown in FIG. 6. The DDMP LSI of the present embodiment includes a megaengine 80 (ME1) and a megaengine 82 (ME2) connected in series.

Figures 7, 8:
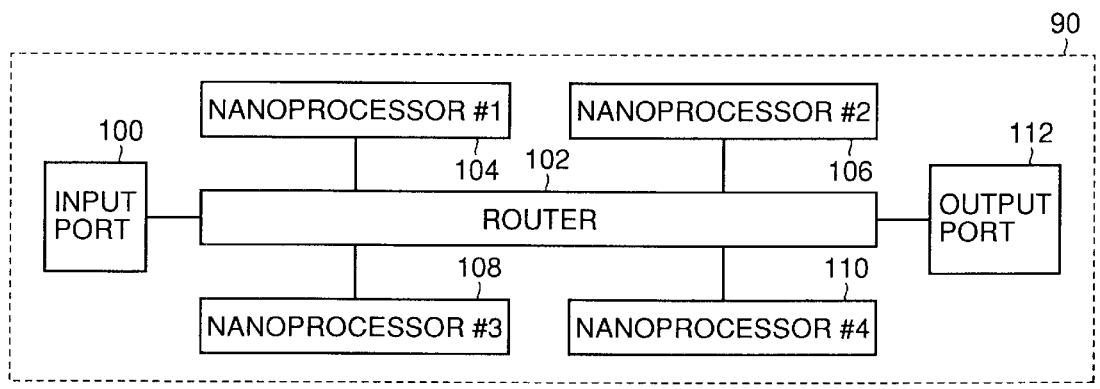
FIG. 7 shows an example of structural elements of the megaengine of the DDMP.
FIG. 8 shows the structure of a macroprocessor of a DDMP.

FIG. 7 shows the elements of megaengine 80 (ME1) and megaengine 82 (ME2). For example, megaengine 80 (ME1) includes two macroprocessors (MP1) and two macroprocessors (MP2).

FIG. 8 shows a structure of macroprocessor 90. Macroprocessor 90 includes an input port 100, a router 102 connected to input port 100, having the function to define the next destination according to the overall decision based on preset routing information or the value of the tag field in the input packet and send out a data packet, four nanoprocessors 104, 106, 108 and 110 connected to router 102, and an output port 112 connected to router 102.

FIG. 9 represents the macroprocessor type and structural elements thereof in a table format. Macroprocessor MP1, for example, includes a router R1, an input port IP1, an output port OP1, and nanoprocessors NP1, NP2, NP3 and NP4.

Figures 10, 11:
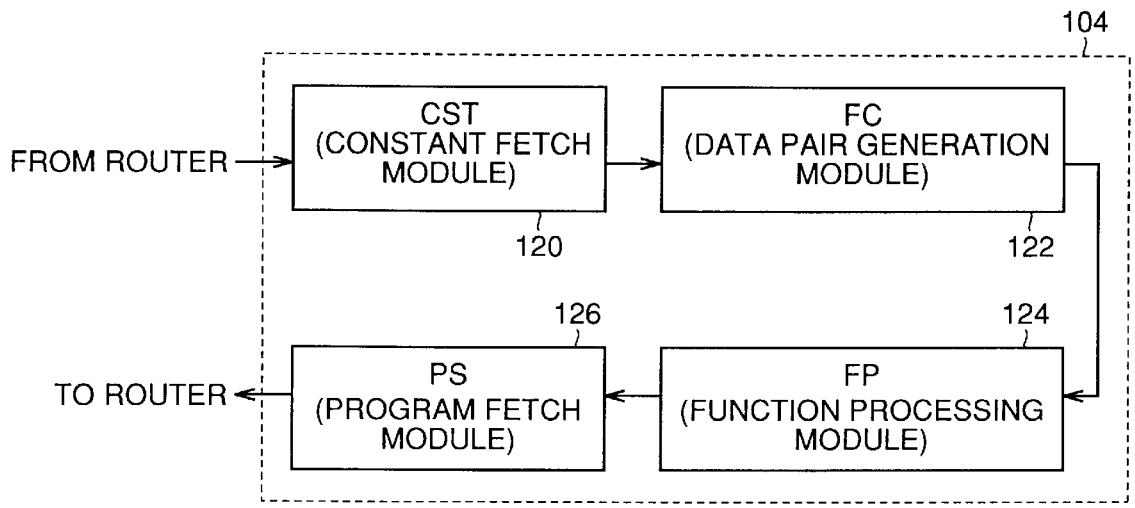
FIG. 10 shows the structure of a nanoprocessor of a DDMP.
FIG. 11 shows an example of structural elements of the nanoprocessor of the DDMP.

Referring to FIG. 10, nanoprocessor 104, for example, includes: a constant fetch module (CST) 120 receiving a data packet from router 102 to determine whether the input packet requires constant data or not according to an instruction code, and fetching, when necessary, the relevant constant data from its own memory for storage in the packet; a data pair generation module (FC) 122 having an input connected to the output of constant fetch module (CST) 120, storing data until the data required for executing the operation is available, and providing, when the required data is available, the packet including these data; a function processing unit 124 having an input connected to the output of data pair generation module (FC) 122 to carry out the required operation using the operation information in the received packet and data in that packet; and a program fetch module (PS) 126 having an input connected to the output of function processing unit 124. PS 126 is loaded with a data flow program to carry out a predetermined operation process. PS 126 responds to the specified address based on the destination information included in the received packet to read out new destination information and operation information from the data flow program to store the same in the packet and, if further operation is required, provide the data packet to data pair generation module (FC) 122 again.

In nanoprocessor 104, determination is made whether the input packet requires constant data or not by constant fetch module (CST) 120. When required, the relevant constant data is stored in the packet. The packet is sent to data pair generation module (FC) 122. Data pair generation module (FC) 122 determines whether data that are required for operation are available or not. When the data for operation are available, a packet including companion data that becomes the pair for operation is generated and provided to function processing unit 124. Function processing unit 124 implements operation using the operation information and data in the received packet, and provides a packet corresponding to the processed result to program fetch module (PS) 126. Program fetch module (PS) 126 reads out new destination information and operation information by addressing the data flow program based on the destination information of the input packet. Program fetch module (PS) 126 stores the read information in the input packet, and sends the data to data pair generation module (FC) 122 if further operation is required.

The packet flows in the circulation of FC→FP→PS→FC→FP→PS→, whereby the data flow program prestored in program fetch module (PS) 126 is executed. In other words, data is processed in the DDMP LSI as a result of the circulation of a packet through the circuit, particularly circulation in the nanoprocessor.

FIG. 11 shows the elements of nanoprocessors of six types (NP1–NP6) in a table format.

The type and number of megaengines to be prepared in the DDMP LSI are defined by architecture that is defined by the required operation performance, required total memory capacitance and a set of instructions, specified in the LSI specification. Therefore, the DDMP LSI includes a plurality of megaengines as the structural element, and configured by interconnection of the plurality of elements. FIG. 6 corresponds to the case where megaengines ME1 and ME2 are interconnected (serial connection).

As shown in FIGS. 5 and 7, the structural element of a megaengine is a macroprocessor. Similar to the DDMP LSI, the type and numbers of the macroprocessors are defined by the required operation performance, required total memory capacitance, and architecture defined by the set of instructions.

Although the DDMP LSI includes four nanoprocessors in the example shown in FIG. 8, it is to be noted that this number depends upon the LSI specification, and the number of elements is not restricted.

Figure 1:
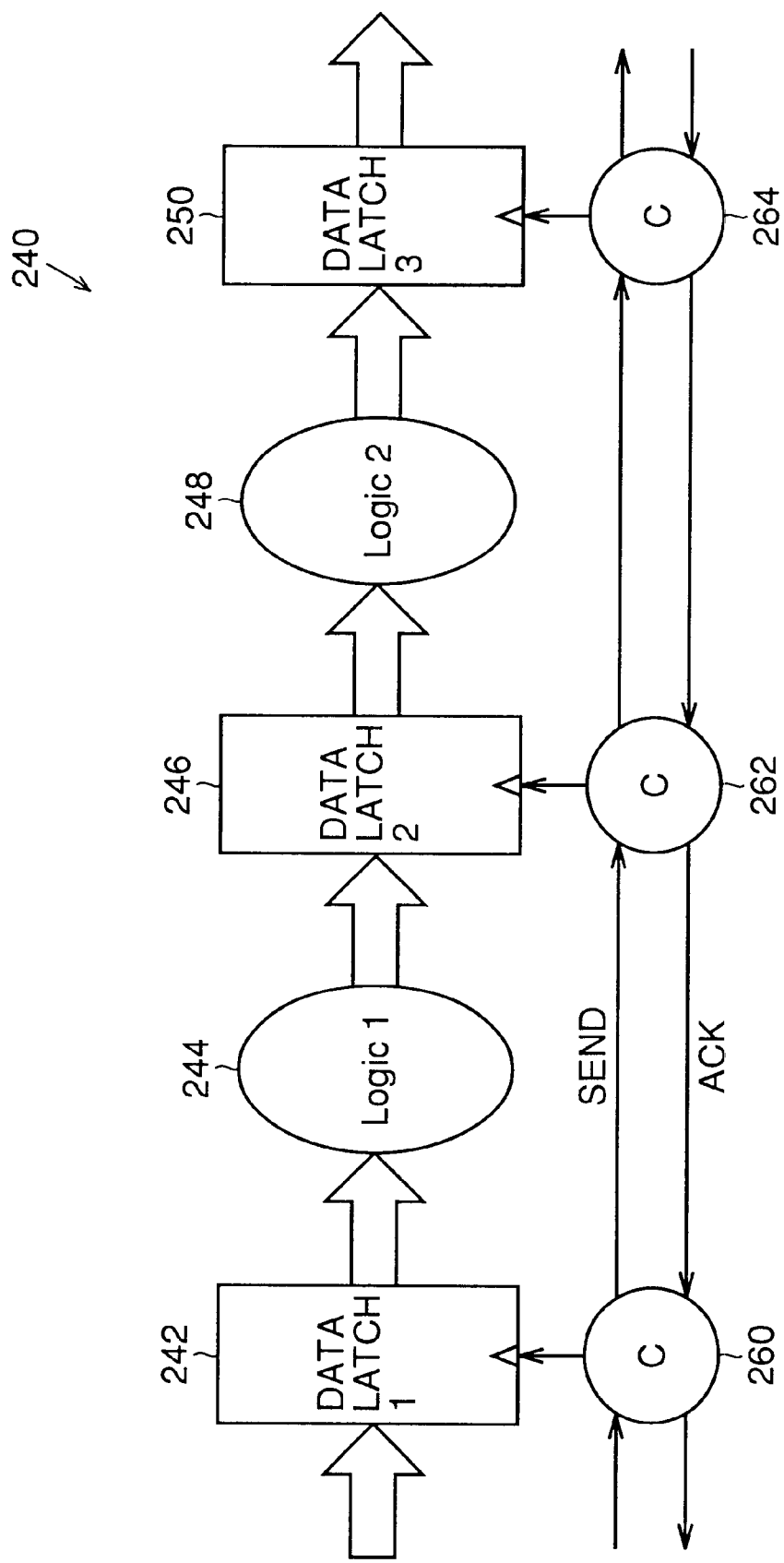
FIG. 1 is a diagram utilized in describing a self-timed pipeline.
Figure 2:
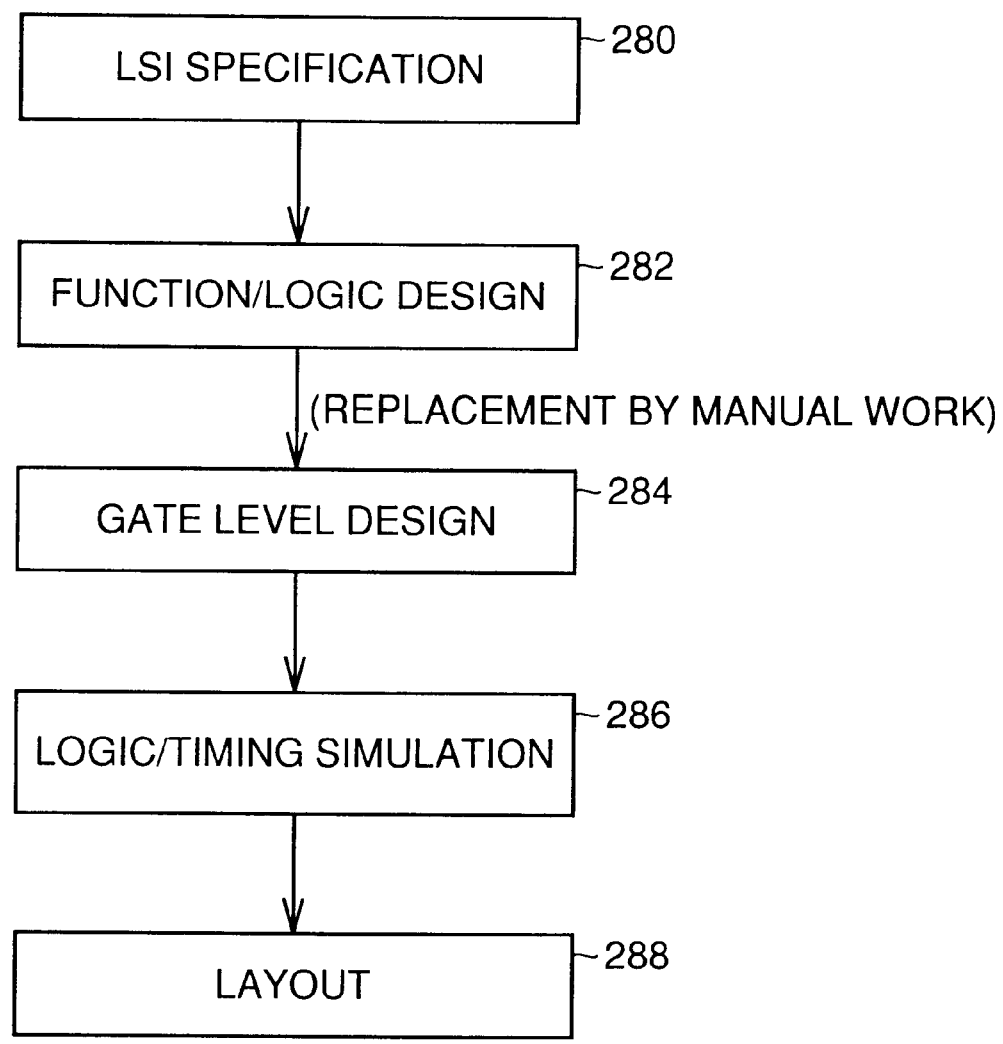
FIG. 2 is a flow chart of designing a DDMP LSI according to a conventional bottom up design procedure.
Figure 3:
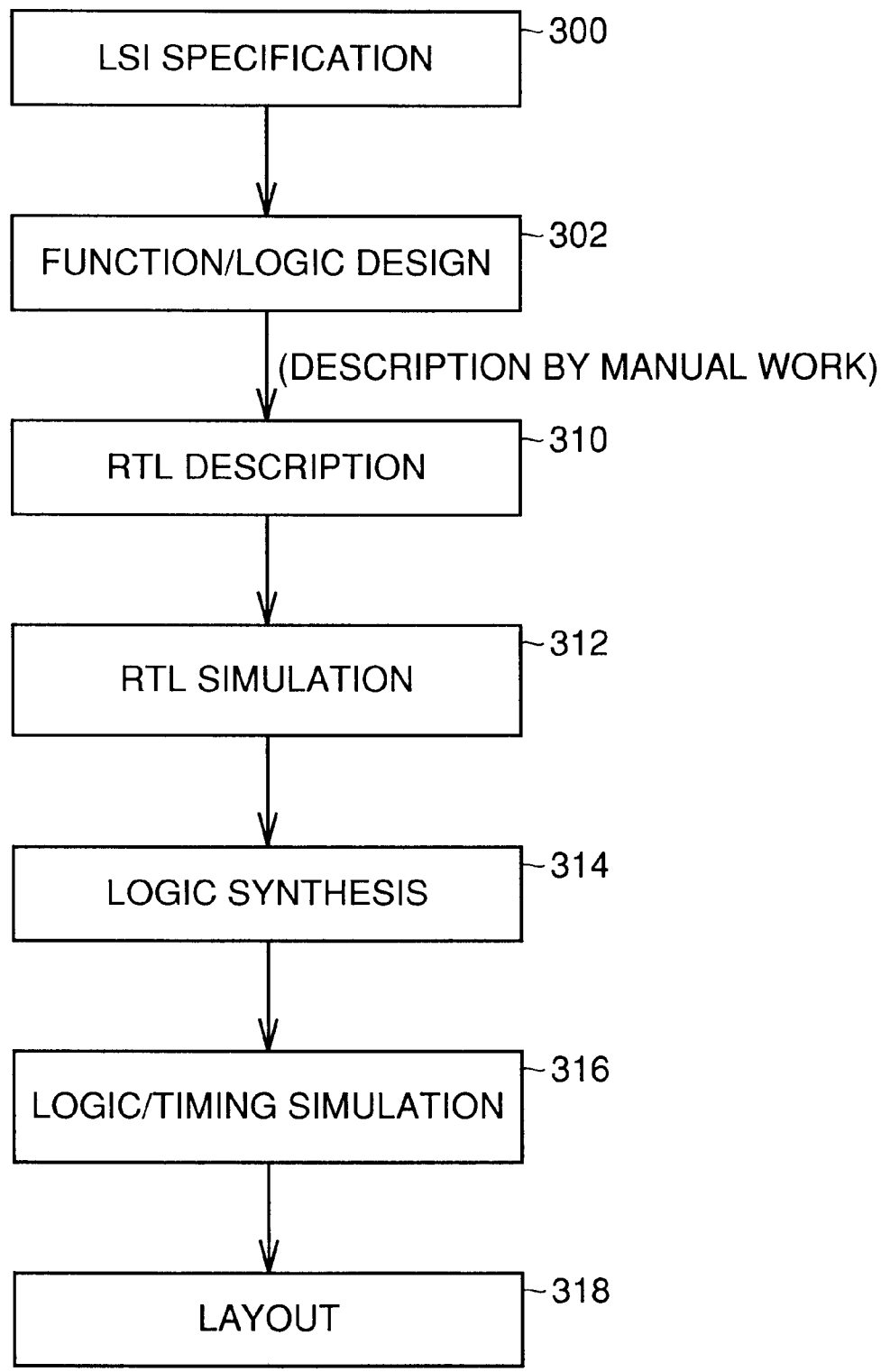
FIG. 3 is a flow chart of designing a DDMP LSI according to a conventional top down design procedure.

The foregoing corresponds to the description of the hierarchical structure and elements of a DDMP. The functional block constituting the lower layer of the hierarchical structure of this DDMP (refer to FIG. 5) includes a constant fetch module CST, a data pair generation module FC and a function processing module FP, and the like. Data transfer by handshaking is effected even in each of these functional blocks as well as between the modules in a functional block. Therefore, the DDMP is thoroughly based, even up to the elements in the lower layer, on the aforementioned structure including local handshake type data transfer control circuits (C element), data latch circuits and logic circuits arranged between the data latch circuits shown in FIG. 1. In other words, the C elements are the critical elements in realizing a DDMP.

The flow of the designing method through a parameterize procedure according to an embodiment of the present invention will be described hereinafter corresponding to the portion where the C element is related with constant fetch module CST as a representative example.

Figure 12:
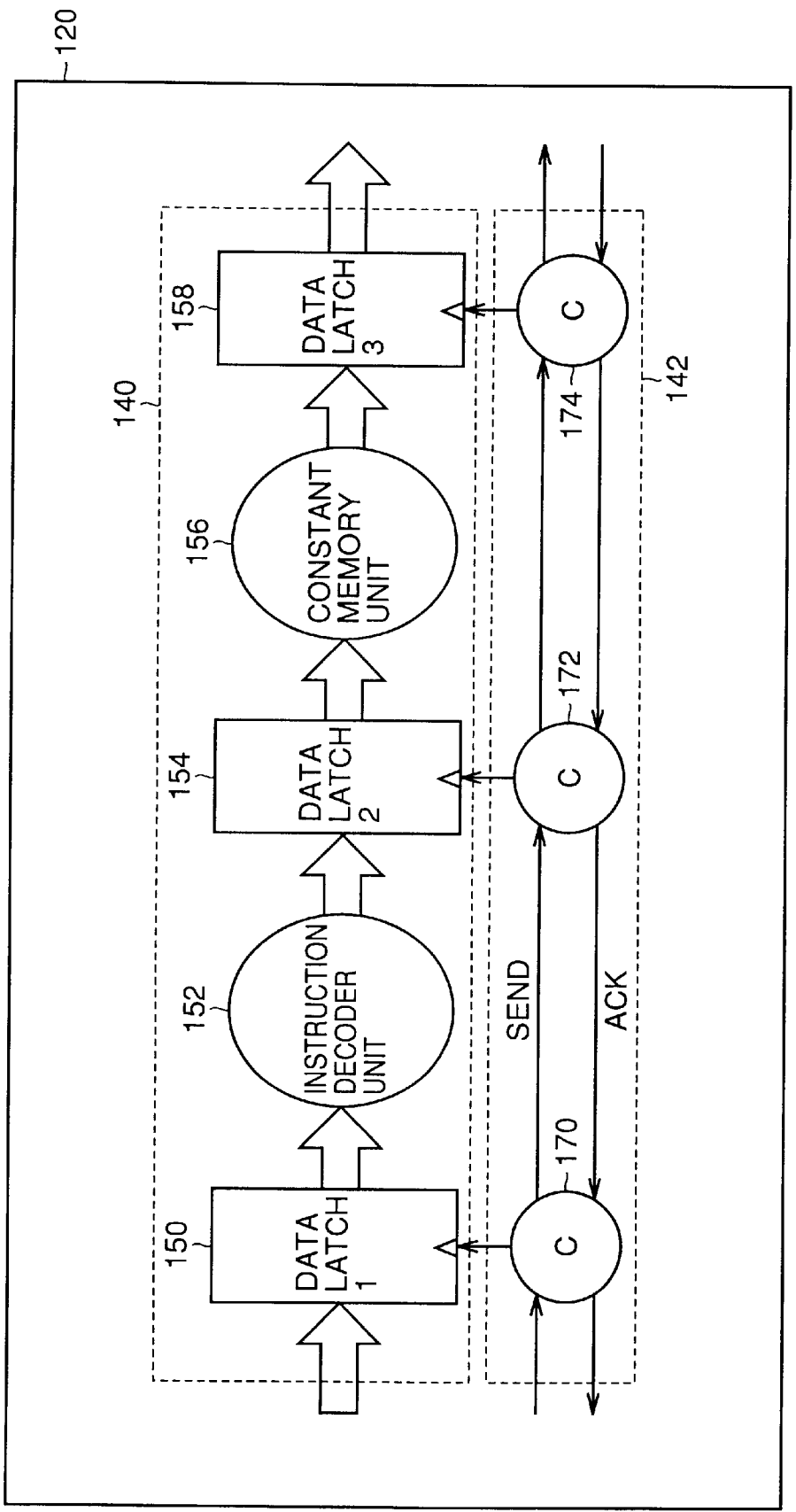
FIG. 12 is a block diagram of the internal structure of a constant fetch (CST) module.

Referring to FIG. 12 showing a structure of constant fetch module CST, constant fetch module (CST) 120 includes a data transfer control unit (CST_TIMING) 142 controlling data transfer according to the handshake scheme which is characteristic of the DDMP, and a data path unit (CST_DATAPATH) 140 to implement the process of determining whether the input data packet requires constant data or not, and if required, fetching the constant data.

Data path unit 140 includes three stages of data latches 150, 154 and 158, an instruction decoder unit 152 arranged between data latches 150 and 154 to determine whether the input data packet requires constant data or not based on an instruction code in a tag region in the data packet, and a constant memory unit 156 arranged between data latches 154 and 158, responsive to determination that constant data is required by instruction decoder unit 152 to fetch the required constant data.

Data transfer control unit 142 includes C elements 170, 172 and 174 provided corresponding to data latches 150, 154 and 158, respectively, to transmit and receive transmission signal SEND and response signal ACK with respect to each other to apply a timing signal to a corresponding data latch circuit.

In the designing method of the present embodiment, the number of stages (three stages in the example of FIG. 12) of the pipeline including data latches 150, 154 and 158 and C elements 170, 172 and 174 is parameterized (parameterization). The design of the number of pipeline stages is an important factor that defines the data width of the data packet, the circuit complexity of the logic unit (instruction decoder and the like), the operation speed of the entire apparatus, power consumption and the like. In the process of optimizing the DDMP design or altering the specification, design of the number of pipeline stages must first be considered. The number of pipeline stages is the critical factor in designing.

By parameterizing the number of stages in the present embodiment, the adaptability of the DDMP design to the required specification can be improved, and the time required for designing can be reduced.

According to the method of the present embodiment, the number of pipeline stages can be easily altered according to the circuit complexity to realize instruction decoder unit 152 and constant memory unit 156. Also, by determining the transfer rate between the pipelines, the delay time in the C elements can be determined correspondingly, which in turn allows the circuit configuration of the C element to be determined. Therefore, the transfer rate between pipelines may be determined.

In the present embodiment, the number of pipeline stages is set referring to the value "PPLN" indicating the number of pipeline stages in the DDMP design parameter file (refer to FIG. 14) which is present in DDMP functional block/processor library 44 of FIG. 4. In the present embodiment, the three values of 2, 5 and 3 are preset for the three conditions that will be described afterwards, i.e., the MIN condition, MAX condition, and TYP condition that is intermediate therebetween, in the DDMP design parameter file. Any one of these three values is selected depending upon which condition is specified.

The values (2 and 5) for the number of pipeline stages PPLN employed in the aforementioned MIN condition and MAX condition are termed the upper limit and the lower limit, respectively. These values are selected so as to define a range that is appropriate for an LSI and to converge the design within an appropriate certain period of time.

The number of pipeline stages in FIG. 12 is three. It is appreciated that the PPLN value of the number of pipeline stages is set to "3" (TYP value).

Figure 13:
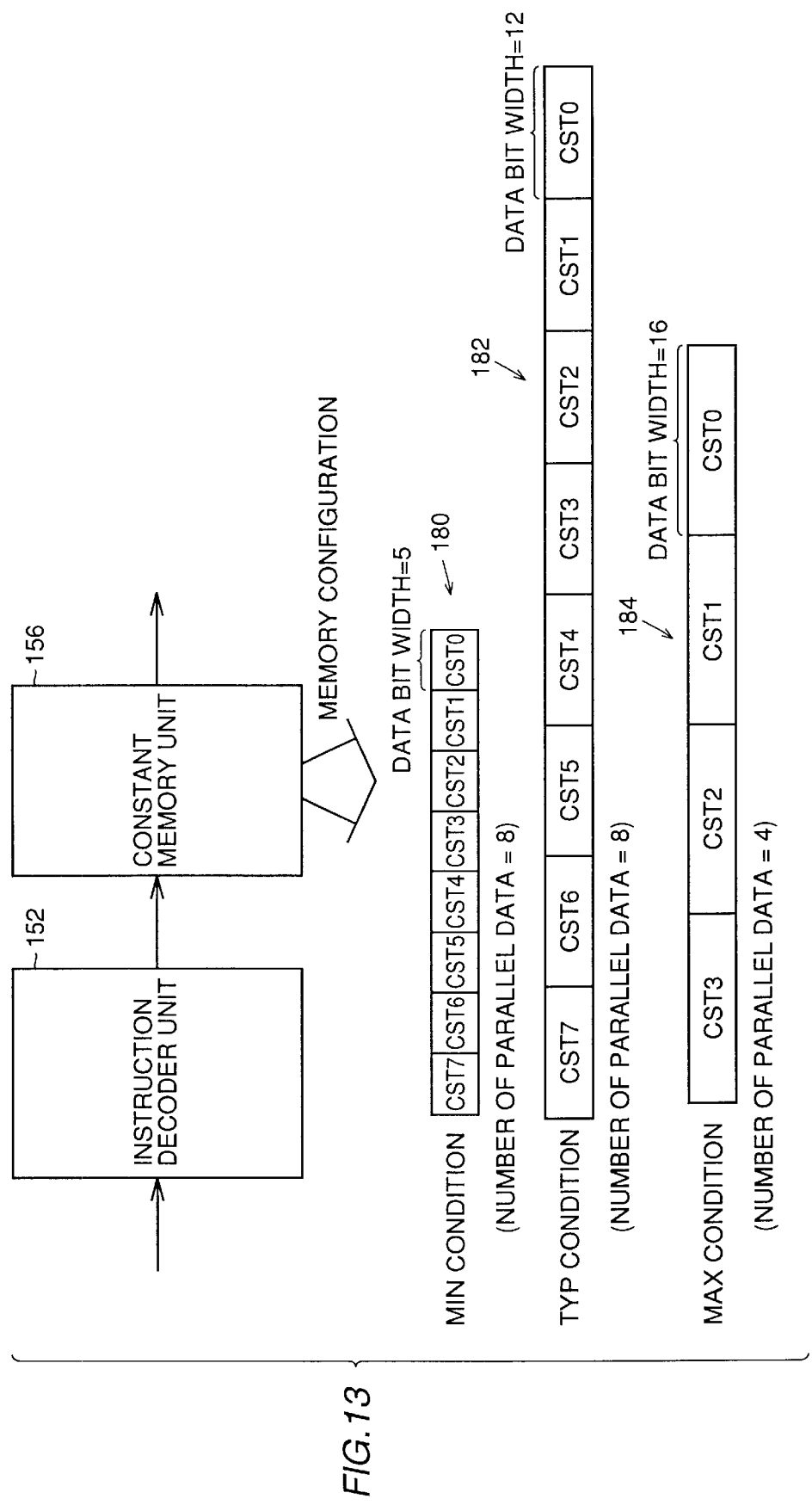
FIG. 13 schematically shows variation in data bit width and number of parallel data in a constant memory unit.

In data transfer control unit 142, elements other than the number of pipeline stages are parameterized. For example, as shown in FIG. 13, the data bit width (DW) and the number of parallel data (ND) stored in constant memory unit 156 are preset as set forth below. Under the MIN condition, the constant group 180 of DW=5 and ND=8 is applied. Under the TYP condition, the constant group 182 of DW=12 and ND=8 is applied. Under the MAX condition, the constant group 184 of DW=16 and ND=4 is applied. The upper limit and the lower limit are selected on a basis similar to that of PPLN.

It is to be noted that the format of the packet transferred through data path unit 140 under control of C elements is also parameterized in the present embodiment.

Although parameterization has been described with constant fetch module (CST) 120 as an example here, the elements required in designing are extracted in advance and respectively parameterized similarly for other functional blocks. A specific RTL descriptor file is produced automatically according to the predetermined parameters at the actual stage of designing.

A specific example of executing a parameterize RTL design tool that produces automatically an RTL descriptor file based on predetermined parameters corresponding to the LSI specification will be described hereinafter in the present embodiment.

FIG. 14 shows a portion of an exemplary DDMP design parameter file (file name: npl_param_define.v) based on a DDMP LSI specification. FIG. 15 shows a portion of a DDMP functional block/processor library file (refer to FIG. 4) of the CST module of nanoprocessor (NP) 1 as an example. FIG. 16 shows a portion of a DDMP functional block/processor library file of the data transfer control unit in the CST module of NP1. FIG. 17 shows a portion of a DDMP functional block/processor library file of the data path unit in the CST module of NP1.

In the DDMP design parameter file of FIG. 14, information for parameterization required in designing a DDMP LSI is written and stored according to a predetermined language system. The information includes:
a user-specified instruction 190 to specify which of the intermediate value (TYP condition), lower limit (MIN condition) and upper limit (MAX condition) is to be selected as a variable CONFIG; and an intermediate value unit 192, an upper limit unit 194 and a lower limit unit 196 provided corresponding to the three conditions. As indicated by the SWITCH statement and CASE statements in FIG. 14, any one of intermediate value unit 192, upper limit unit 194 and lower limit unit 196 is selected depending upon whether the value of variable CONFIG is 1, 2 or 3. The functions of the SWITCH statement and CASE statements are interpreted similar to those of, for example, the C language. Since CONFIG=1 in the example shown in FIG. 14, respective values written in intermediate value unit 192 are used as the parameters.

Each of intermediate value unit 192, upper limit unit 194 and lower limit unit 196 includes the values such as the number of pipeline stages (PPLN), the bit width (DW) of data in the data packet or megaengine structural element, the number of parallel data (ND), the width of destination node number (ND_WIDTH), the width of generation number (GN_WIDTH), the data width (FC_DATA_MEMORY_WIDTH) of the memory in the FC and the like.

Referring to the data bit width DW, for example, the values of 12, 16 and 5 are set for the intermediate value, upper limit and lower limit, respectively. Referring to the number of parallel data ND, the values are 8, 4 and 8 for the intermediate value, upper limit and lower limit, respectively. Referring to the number of pipeline stages PPLN, the values are 2, 5 and 3 for the intermediate value, upper limit and lower limit, respectively.

The DDMP functional block/processor library files shown in FIGS. 15, 16 and 17 are all prototypes to produce an RTL description according to the specified parameters in the DDMP design parameter file. In the description shown in FIGS. 15–17, the DDMP design parameter file is included by the "include" statement, which is replaced with the contents in a the DDMP design parameter file, prior to the generation of the RTL description. This statement is placed at the head portion of the RTL description, at a location preceding the portion where the parameters are referred to. Accordingly, the selected values from the set of parameters in the DDMP design parameter file are reflected into the prototype file. By executing the parameterize RTL design tool, an RTL description is produced automatically.

FIGS. 18, 19 and 20 show a portion of the RTL description of the CST module of NP1, a portion of the RTL description of the CST1_TIMING module of the CST module, and a portion of the RTL description of the CST1_DATAPATH module of the CST module, respectively, produced by executing the parameterize RTL design tool. It is assumed that the TYP condition (CONFIG=1) is selected as the condition.

For example, the RTL descriptor file of the CST module under the TYP condition shown in FIG. 20 includes an NP1 global parameter declare unit 210 and a CST1-inherent parameter declare unit 212.

At the first line in NP1 global parameter declare unit 210, the data bit width (DW)=12 written in intermediate value unit 192 of FIG. 14 is reflected as data_width=12. Similarly, the number of parallel data (ND)=8 written in intermediate value unit 192 of FIG. 14 is reflected as num_data=8. The same applies for the other parameters.

FIG. 21 shows an example of an RTL descriptor file produced when the MAX condition (CONFIG=2) is selected. Likewise the file shown in FIG. 20, this file includes an NP1 global parameter declare unit 214 and a CST1-inherent parameter declare unit 216.

At the first line in NP1 global parameter declare unit 214, the data bit width (DW)=16 written in upper limit unit 194 of FIG. 14 is reflected as data_width=16. Similarly, a number of parallel data (ND)=4 written in upper limit unit 194 of FIG. 14 is reflected as num_data=4. The same applies to the remaining parameters.

In the present embodiment, the parameter values corresponding to the selected one of the conditions written in the DDMP design parameter file are reflected in the RTL description, whereby the required parameter value are written in the RTL descriptor file. As a result, designing with respect to a variety of specifications can be carried out in a short period of time. Furthermore, design modification can be achieved in a short period of time with respect to change in the specification.

The above-described embodiment corresponds to an example where only the number of pipeline stages (PPNL), the data bit width (DW) and the number of parallel data (ND) in the CST module of nanoprocessor NP1 are parameterized hierarchically. It will be understood that the present invention is not limited to such an application, and can be applied to all levels of hierarchy from the top layer to the bottom layer of each of the megaengine, macroprocessor, router, input port, output port, nanoprocessor, and functional unit.

FIG. 22 shows exemplary parameters applicable to each functional block including the CST module. Each row in FIG. 22 corresponds to a functional block. Each column respects a parameter. In the table of FIG. 22, the combination of a functional block and a parameter allotted with ○ indicates that parameterization is allowed.

For example, as to the functional block of CST, the values of the number of parallel data, the number of data bits, the bit width of node number, the number of pipeline stages, as well as discrimination between synchronous/asynchronous, number of ports and the presence/absence of bit write function corresponding to the data memory type can be parameterized.

As to the functional block of FP, the number of parallel data, the data bit width, the accumulator bit width, and the number of pipeline stages can be parameterized.

Thus, according to the flow shown in FIG. 4, the obtained RTL descriptor file is used to generate a net-list by logic synthesis using a general logic synthesis tool, followed by logic/timing simulation to eventually implement the layout.

According to the present embodiment, there are prepared at the DDMP LSI level a functional block/processor library of a data driven information processor, design parameter values determined according to the DDMP LSI specification, and a parameterize RTL design tool having these functional block/processor library and design parameter values as the input.

By operating the parameterize RTL design tool, an RTL description is produced automatically. As a result, the designing time for the DDMP LSI can be reduced significantly. Also, the designing cost can be reduced.

These advantages are achieved by parameterizing the number of pipeline stages of the data transfer control unit that is characteristic of the DDMP. Designing the number of pipeline stages is an important factor in defining the data width of the data packet, the circuit complexity of a logic unit, the operation speed of the entire apparatus, power consumption and the like. The number of pipeline stages is an important issue that is always first considered in the case of optimizing the DDMP design or when the specification is altered. Parameterization of the number of pipeline stages contributes to the adaptability of DDMP design to the design specification and reduction of the designing period.

Furthermore, parameterizing the transfer rate is an important factor in determining the delay time in the C element to allow the circuit configuration of the C element to be readily defined.

Although less effective than the number of pipeline stages and the transfer rate, parameterization of other design elements also contribute to the adaptability of the DDMP design to the design specification and reduction of the designing period in no small way.

According to the present embodiment, a register transfer level design description matching the design specification can be produced automatically to allow the time required for designing to be reduced. A variety of specifications and modification can be easily accommodated in designing. Since a library file is used, the resource from the past can be accumulated to be used.

According to the present embodiment, a register transfer level description can be produced automatically using a set of matching parameter values by just selecting one of a set of parameters corresponding to the design specification in specifying the parameter. This facilitates DDMP LSI designing.

Furthermore, appropriate parameter values for each element forming the portion to be designed in a data driven information processor can be set. Also, the circuit configuration of the transfer control element can easily be determined.

In the above-described embodiment, three sets of parameters are preset, from which one is selected. The number of the sets of parameters is not limited to 3. Two or more than three sets can be prepared. Particularly as to the upper limit and lower limit, the values can be altered based on the subject of designing, the facility for designing, and the precision required in designing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of designing a data driven information processor employing self-timed pipeline control through use of a computer, said method comprising the steps of:
    preparing a computer-readable library file in which is written a designing parameter, in a generalized format related to a functional block and processor of a data driven information processor that is a subject of design,
    setting a parameter value for each said designing parameters according to a design specification, and
    executing on said computer a tool that rewrites each description of a parameter in said library file using said set parameter value and producing a register transfer level design description.

2. The method of designing a data driven information processor according to claim 1, wherein said step of setting a parameter value comprises the steps of
    preparing in advance a plurality of sets of said designing parameters, and
    selecting one of said plurality of sets of parameter values according to the design specification.

3. The method according to claim 2, wherein said designing parameter includes the number of pipeline stages forming a portion of said data driven information processor that is the subject of design.

4. The method according to claim 3, wherein said step of preparing a plurality of sets includes the steps of preparing
    a set including a predetermined upper limit of the number of pipeline stages, and
    a set including a predetermined lower limit of the number of pipeline stages.

5. The method according to claim 4, wherein said step of preparing a plurality of sets further includes the step of preparing a set including a value selected in advance between said upper limit and said lower limit of the number of pipeline stages.

6. The method according to claim 1, wherein said design parameter includes the number of pipeline stages forming a portion of said data driven information processor that is the subject of design.

7. The method according to claim 6, wherein said design parameter further includes transfer speed of a transfer control element controlling data transfer in said pipeline.

8. The method according to claim 1, wherein said design parameter includes transfer speed of a transfer control element controlling data transfer in said pipeline.

9. The method according to claim 1, wherein said step of preparing a library file includes the step of preparing a computer-readable library file in which is generally written for each type of a functional block and processor a designing parameter related to the functional block and processor of a data driven information processor that is the subject of design.

10. The method according to claim 1, further comprising the steps of:
running a circuit simulation of a register transfer level based on said register transfer level design description,
applying logic synthesis on the register transfer level design description verified by said transfer level circuit simulation to produce a net-list,
verifying the obtained net-list, and
effecting layout of a semiconductor integrated circuit device using the verified net-list.

11. A method of designing a data driven information processor employing self-timed pipeline control through use of a computer, said method comprising the steps of:
preparing a computer readable library file formed of a register transfer level design description including a designing parameter written in a general format and using a predetermined language, related to a functional block and processor of a data driven information processor that is a subject of design,
preparing a computer-readable parameter file in which is written an instruction setting a specific parameter value for each of said designing parameters in said predetermined language according to a design specification,
producing a register transfer level design description having a specific parameter value set by executing a program that reads in said library file and said parameter file, and rewrites said library file so as to include contents of said parameter file, prior to writing a parameter in said library file, and
implementing circuit designing using said register transfer level design description having said specific parameter value set.

12. The method according to claim 11, wherein
said library file comprises an include instruction specifying inclusion of said parameter file, written at a position preceding description of said designing parameter, and
said program has a function of replacing an include instruction with contents of a file specified by said include instruction, by encountering said include instruction.

13. The method according to claim 12, wherein said step of preparing a parameter file comprises the steps of
preparing a file in which are written a plurality of sets of instructions using said predetermined language to set each of said plurality of parameters for each separate set of parameter values prepared in advance, and an instruction selecting which of said plurality of sets of instructions is to be executed according to a parameter for selection, and
setting a specific value for said parameter for selection.

14. An apparatus of designing a data driven information processor employing self-timed pipeline control through use of a computer, said apparatus comprising:
a storage device storing a computer-readable library file in which is generally written a designing parameter related to a functional block and processor of a data driven information processor that is a subject of design,
an input device setting a parameter value for each said designing parameter according to a design specification, and
an execution device executing a tool that rewrites each description of the parameter in said library file using said set parameter value and producing a register transfer level design description.

15. The apparatus according to claim 14, wherein
said storage device stores a plurality of sets of parameter values of said designing parameters in advance, and
said input device setting a parameter value includes a device selecting one of said plurality of sets of parameter values according to a design specification.

16. The apparatus according to claim 15, wherein said designing parameter includes the number of pipeline stages forming a portion of said data driven information processor that is the subject of design.

17. The apparatus according to claim 16, wherein said plurality of sets of designing parameter values comprises
a set including a predetermined upper limit of the number of pipeline stages, and
a set including a predetermined lower limit of the number of pipeline stages.

18. The apparatus according to claim 17, wherein said plurality of sets of designing parameter values further comprises a set including a value selected in advance between said upper limit and said lower limit of the number of pipeline stages.

19. The apparatus according to claim 14, wherein said designing parameter includes the number of pipeline stages forming a portion of said data driven information processor that is the subject of design.

20. The apparatus according to claim 19, wherein said designing parameter further includes transfer speed of a transfer control element controlling data transfer in said pipeline.

21. The apparatus according to claim 14, wherein said designing parameter includes transfer speed of a transfer control element controlling data transfer in said pipeline.

22. The apparatus according to claim 14, wherein said library file includes a computer-readable library file in which is generally written for each type of functional block and processor a designing parameter related to the functional block and processor of a data driven information processor that is the subject of design.

23. The apparatus according to claim 14, further comprising:
a circuit simulator running a circuit simulation of a register transfer level based on said register transfer level design description,
a logic synthesis circuit applying logic synthesis on the register transfer level design description verified by said circuit simulation of the transfer level and producing a net-list, a verify circuit verifying the obtained net-list, and a layout device implementing layout of a semiconductor integrated circuit device using the verified net-list.

24. An apparatus of designing a data driven information processor employing self-timed pipeline control through use of a computer, said apparatus comprising:

a first storage device storing a computer-readable library file formed of a register transfer level design description including a design parameter written in a general format and using a predetermined language, related to a functional block and a processor of a data driven information processor that is a subject of design, a second storage device storing a computer-readable parameter file in which is written an instruction that sets a specific parameter value for each said design parameter in said predetermined language according to a design specification, a third storage device storing a program that reads in said library file and said parameter file, and rewrites said library file so as to include contents of said parameter file, prior to writing a parameter in said library file, and a circuit design processing device implementing circuit designing using said register transfer level design description having a specific parameter value set.

25. The apparatus according to claim 24, wherein said library file includes an include instruction specifying inclusion of said parameter file, written at a location preceding description of said designing parameter, and wherein said program has a function of replacing an include instruction with contents of a file specified by said include instruction by encountering an include instruction.

26. The apparatus according to claim 25, wherein said parameter file comprises a file in which are written a plurality of sets of instructions using said predetermined language to set each of said plurality of parameters for each separate set of parameter values prepared in advance, and an instruction selecting which of said plurality of sets of instructions is to be executed according to a parameter for selection, and said apparatus further comprising an input device to set a specific value of said parameter for selection.

* * * * *